United States Patent
Boochakorn et al.

(10) Patent No.: US 6,276,038 B1
(45) Date of Patent: Aug. 21, 2001

(54) APPARATUS FOR GRIPPING A PLUG OF AN IC PACKAGE CONTAINER DURING REMOVAL OF THE PLUG

(75) Inventors: Sa-Nguan Boochakorn, Bangkok; Jhakkrit Theppornpitak, Phathumthanee; Phontara Jirawongsapiwat, Bangkok, all of (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/609,755

(22) Filed: Jul. 3, 2000

(51) Int. Cl.[7] .................................................. B25B 1/08
(52) U.S. Cl. .............................................. 29/281.5; 29/283
(58) Field of Search .............................. 269/156, 34, 43, 269/228, 329, 903; 29/283, 281.1, 281.5, 282, 234, 237

(56) References Cited

U.S. PATENT DOCUMENTS 4,294,444 * 10/1981 Horton ................................. 269/156

* cited by examiner

Primary Examiner—Robert C. Watson
(74) Attorney, Agent, or Firm—Monica H. Choi

(57) ABSTRACT

Pincher vises move towards each other for gripping a plug of an IC package container such that the IC package container may be pulled away from the plug. A first pincher vise is at a gripping position when the first pincher vise is gripping the plug and is at a freeing position when the first pincher vise is not gripping the plug. A second pincher vise is at a gripping position when the second pincher vise is gripping the plug and is at a freeing position when the second pincher vise is not gripping the plug. A pushing rod is coupled to the first pincher vise and the second pincher vise, and a motion translation mechanism moves the first pincher vise and the second pincher vise to the gripping position when the pushing rod is pushed down, and moves the first pincher vise and the second pincher vise to the freeing position when the pushing rod is no longer pushed down after the IC package container has been pulled away from the plug. In this manner, the pincher vises grip the plug of the IC package container such as an IC package tube such that the operator does not grip the plug as the operator pulls the IC package container away from the plug. During manufacture of a high quantity of IC packages, the operator is saved from the hand fatigue and hand pain of using a tweezer to repeatedly grip plugs of a high quantity of IC package tubes.

13 Claims, 7 Drawing Sheets

APPARATUS FOR GRIPPING A PLUG OF AN IC PACKAGE CONTAINER DURING REMOVAL OF THE PLUG

TECHNICAL FIELD

The present invention relates generally to manufacture of IC (integrated circuit) packages, and more particularly, to a mechanism for gripping a plug of an IC package container such as a tube such that the tube may be forcibly pulled away from the plug for removal of the plug from the tube.

BACKGROUND OF THE INVENTION

Referring to FIG. 1, during manufacture of IC (integrated circuit) packages, the IC packages are transported in an IC package container such as an IC package tube 102. Plugs are wedged into the ends of the IC package tube 102 including a first plug 104 at one end of the tube 102 and a second plug 106 at the other end of the tube 102. (The portion of the plugs 104 and 106 inside the tube 102 is shown by dashed lines in FIG. 1.) The tube 102 may be comprised of steel or plastic, and such tubes are known to one of ordinary skill in the art of IC package manufacture.

During manufacture of IC packages, the IC packages are transferred from one tube to another tube such as from a tube comprised of steel to a tube comprised of plastic or vice versa. Thus, any of the plugs 104 and 106 may be removed from the tube 102 such that IC packages may be added to or removed from the tube 102. Referring to FIG. 2, for removal of the plug 106 from the tube 102, for example, a tweezer 110 is used in the prior art by an operator to manually grip the plug 106 such that the tube 102 and the plug 106 may be pulled away from each other.

However, the operator typically must grip the tweezer 110 with much force such that the tube 102 and the plug 106 may be pulled away from each other. During manufacture of a high quantity of IC packages, such repeated use of the tweezer 110 for removal of the plugs from a high quantity of tubes in the prior art may result in hand fatigue and even hand pain for the operator. In addition, if the tweezer 110 slips during use for gripping a plug, the sharp edges of the tweezer 110 may injure the operator.

Thus, a mechanism for tightly gripping the plug of an IC package tube is desired such that the tube and the plug may be pulled away from each other during manufacture of a high quantity of IC packages.

SUMMARY OF THE INVENTION

Accordingly, in a general aspect of the present invention, an apparatus and method for gripping a plug of an IC package container includes pincher vises that move towards each other for gripping the plug such that the IC package container may be pulled away from the plug.

In a general aspect of the present invention, a first pincher vise is at a gripping position when the first pincher vise is gripping the plug and is at a freeing position when the first pincher vise is not gripping the plug. A second pincher vise is at a gripping position when the second pincher vise is gripping the plug and is at a freeing position when the second pincher vise is not gripping the plug. A pushing rod is coupled to the first pincher vise and the second pincher vise, and a motion translation mechanism moves the first pincher vise and the second pincher vise to the gripping position when the pushing rod is pushed down, and moves the first pincher vise and the second pincher vise to the freeing position when the pushing rod is no longer pushed down after the IC package container has been pulled away from the plug.

In one embodiment of the present invention, the motion translation mechanism includes driving rods and toggle beams coupled to the pincher vises and the pushing rod. A first driving rod has a top end and a bottom end, and the top end of the first driving rod is disposed through the first pincher vise at a first rod position of the first pincher vise. A first pivot is disposed through the first pincher vise at a first pivot location of the first pincher vise. A movement of the first driving rod correspondingly moves a portion of the first pincher vise at the first rod position of the first pincher vise such that the first pincher vise rotates about the first pivot that is fixed at the first pivot location of the first pincher vise. The first driving rod moves to an extended position such that the first pincher vise rotates about the first pivot toward the gripping position, and to an unextended position such that the first pincher vise rotates about the first pivot toward the freeing position.

In addition, a second driving rod has a top end and a bottom end, and the top end of the second driving rod is disposed through the second pincher vise at a second rod position of the second pincher vise. A second pivot is disposed through the second pincher vise at a second pivot location of the second pincher vise. A movement of the second driving rod correspondingly moves a portion of the second pincher vise at the second rod position of the second pincher vise such that the second pincher vise rotates about the second pivot that is fixed at the second pivot location of the second pincher vise. The second driving rod moves to an extended position such that the second pincher vise rotates about the second pivot toward the gripping position, and to an unextended position such that the second pincher vise rotates about the second pivot toward the freeing position.

Furthermore, a first toggle beam has an outward end and a center end, and the outward end of the first toggle beam is coupled to the bottom end of the first driving rod. A second toggle beam has an outward end and a center end, and the outward end of the second toggle beam is coupled to the bottom end of the second driving rod. The pushing rod is coupled to the center end of the first toggle beam and to the center end of the second toggle beam. The first driving rod and the second driving rod are at the unextended position such that the first pincher vise and the second pincher vise are at the freeing position when the pushing rod is not pushed down. The pushing rod is pushed down such that the first toggle beam moves the first driving rod to the extended position to move the first pincher vise to the gripping position, and such that the second toggle beam moves the second driving rod to the extended position to move the second pincher vise to the gripping position.

The present invention may be used to particular advantage when a magnetic solenoid is coupled to the pushing rod for providing an added downward force on the pushing rod when the pushing rod is pushed down. In that case, a switch, coupled to the magnetic solenoid and disposed to contact the pushing rod, is turned on when the pushing rod is pushed down to turn on the magnetic solenoid for providing the added downward force on the pushing rod, and is turned off when the pushing rod moves back up to turn off the magnetic solenoid.

In this manner, the pincher vises grip the plug of the IC package container such as a tube such that the operator does not grip the plug as the operator pulls the IC package container away from the plug. During manufacture of a high quantity of IC packages, the operator is saved from the hand fatigue and hand pain of using a tweezer to repeatedly grip plugs of a high quantity of IC package tubes in the prior art.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and function.

DETAILED DESCRIPTION

Figure 1:
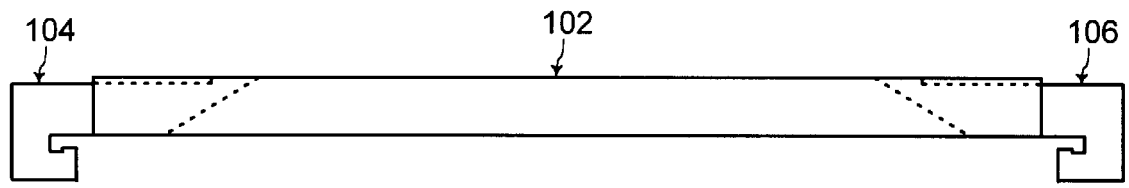
FIG. 1 shows an example IC package container, such as an IC package tube having a respective plug at each of the two ends of the IC package tube.
Figure 2:
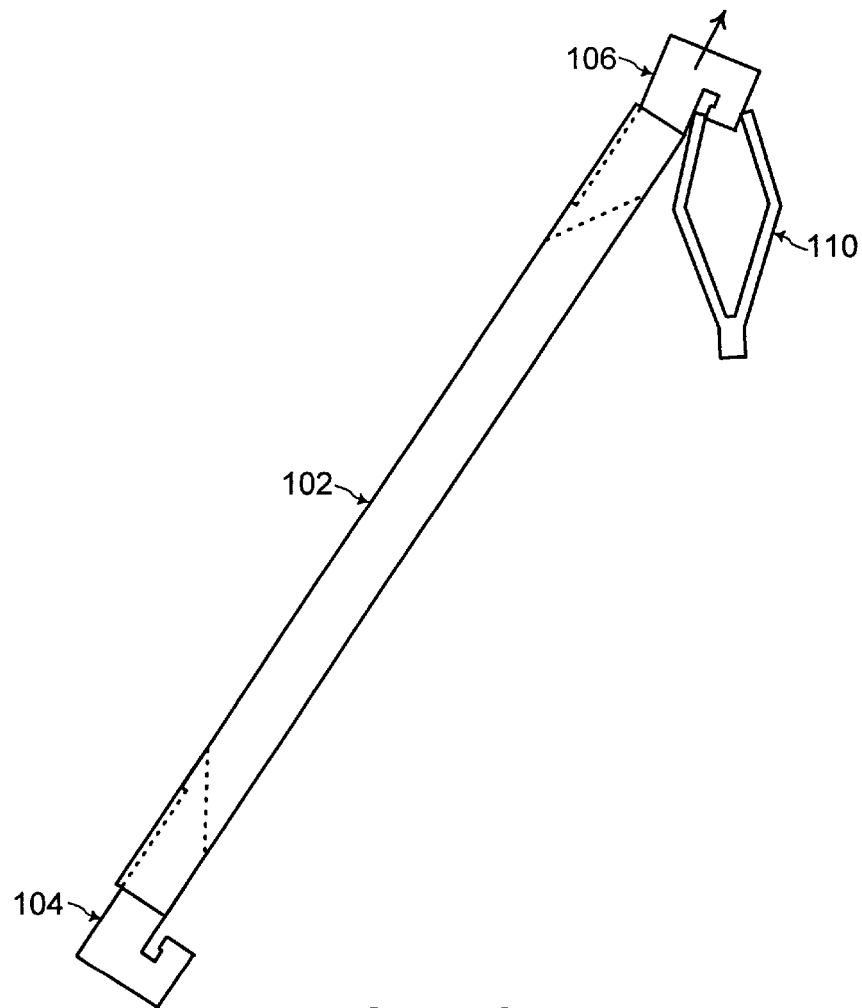
FIG. 2 illustrates the use of a tweezer by an operator for manually gripping the plug of an IC package tube such that the plug and the IC package tube may be pulled away from each other, according to the prior art.
Figure 3:
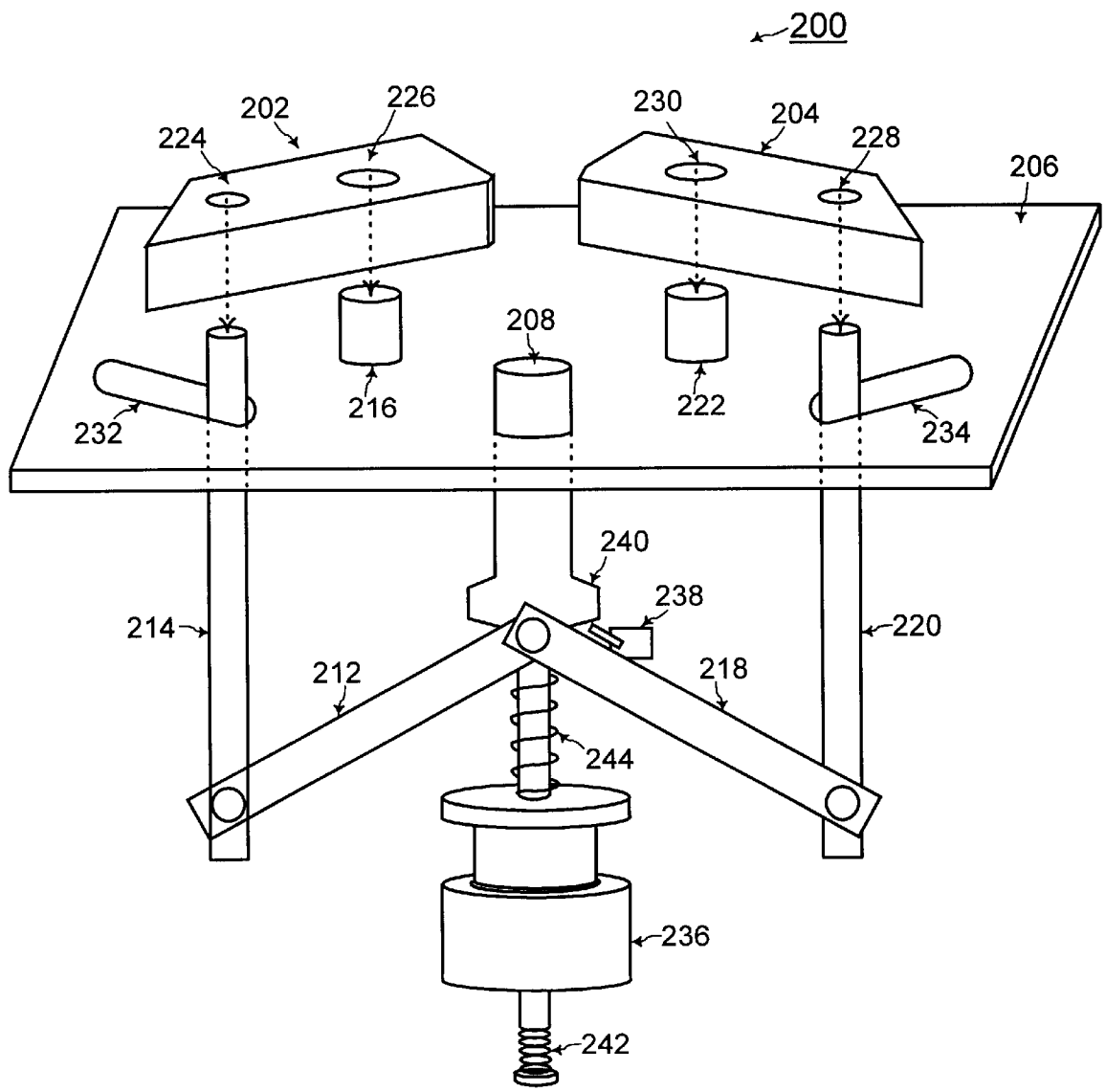
FIG. 3 shows component parts of an apparatus including pincher vises that move toward each other for gripping the plug of an IC package tube such that the IC package tube may be pulled away from the plug, when a pushing rod is not pushed down such that the pincher vises are apart, according to an embodiment of the present invention.

Referring to FIG. 3, an apparatus 200 includes a first pincher vise 202 and a second pincher vise 204 for gripping the plug of an IC package container, such as the IC package tube 102 of FIG. 1. The first pincher vise 202 and the second pincher vise 204 are set on a table surface 206. However, the first pincher vise 202 and the second pincher vise 204 are shown elevated in FIG. 3 to illustrate the driving rod and the pivot disposed through each of the pincher vises 202 and 204. The first pincher vise 202 and the second pincher vise 204 move towards each other to a gripping position when the pincher vises 202 and 204 are gripping a plug of the IC package tube and move apart from each other to a freeing position when the pincher vises 202 and 204 are not gripping the plug of the IC package tube.

The apparatus 200 also includes a pushing rod 208 that initially extends up above the table surface 206 when the pushing rod 208 is not pushed down. The pushing rod 208 is coupled to the first pincher vise 202 and the second pincher 204 through a motion translation mechanism that includes a first toggle beam 212, a first driving rod 214, and a first pivot 216 for the first pincher vise 202 and that includes a second toggle beam 218, a second driving rod 220, and a second pivot 222 for the second pincher vise 204. The motion translation mechanism moves the first pincher vise 202 and the second pincher vise 204 towards each other to a gripping position when the pushing rod is pushed down. On the other hand, the motion translation mechanism moves the first pincher vise 202 and the second pincher vise 204 away from each other to a freeing position when the pushing rod is no longer pushed down.

Referring to FIG. 3, the top end of the first driving rod 214 is disposed through the first pincher vise 202 at a first rod position 224 of the first pincher vise 202 (as illustrated by the dashed arrow in FIG. 3). The first pivot 216 is disposed through the first pincher vise 202 at a first pivot position 226 of the first pincher vise 202 (as illustrated by the dashed arrow in FIG. 3). The first driving rod 214 and the first pivot 216 fit through the first pincher vise 202 when the first pincher vise 202 is lowered onto the first driving rod 214 and the first pivot 216 (as illustrated by the dashed arrows in FIG. 3). However, the first pincher vise 202 is shown elevated above the first driving rod 214 and the first pivot 216 in FIG. 3 for clarity of illustration of the first driving rod 214 and the first pivot 216.

Similarly, the top end of the second driving rod 220 is disposed through the second pincher vise 204 at a second rod position 228 of the second pincher vise 204 (as illustrated by the dashed arrow in FIG. 3). The second pivot 222 is disposed through the second pincher vise 204 at a second pivot position 230 of the second pincher vise 204 (as illustrated by the dashed arrow in FIG. 3). The second driving rod 220 and the second pivot 222 fit through the second pincher vise 204 when the second pincher vise 204 is lowered onto the second driving rod 220 and the second pivot 222 (as illustrated by the dashed arrows in FIG. 3). However, the second pincher vise 204 is shown elevated above the second driving rod 220 and the second pivot 222 in FIG. 3 for clarity of illustration of the second driving rod 220 and the second pivot 222.

The top end of the first driving rod 214 is placed through a first slant opening 232 of the table surface 206, and the top end of the second driving rod 220 is placed through a second slant opening 234 of the table surface 206. The first slant opening 232 and the second slant opening 234 define the movement of the first driving rod 214 and the second driving rod 220, respectively, as the pushing rod 208 is pushed down or moves back up.

The bottom end of the first pushing rod 214 is coupled to an outward end of the first toggle beam 212, and a center end of the first toggle beam 212 is coupled to the pushing rod 208. Similarly, the bottom end of the second pushing rod 220 is coupled to an outward end of the second toggle beam 218, and a center end of the second toggle beam 218 is coupled to the pushing rod 208.

A magnetic solenoid 236 is coupled to the bottom of the pushing rod 208 for providing an additional downward force on the pushing rod 208 when the pushing rod 208 is pushed down. The magnetic solenoid 236 operates to provide the additional downward force when an electric power source is available and coupled to the magnetic solenoid 236.

A switch 238 is coupled to the magnetic solenoid 236 and is disposed under a protruding portion 240 of the pushing rod 208. The protruding portion 240 of the pushing rod 208 toggles the switch to turn on and off as the pushing rod is pushed down or moves back up.

A first spring 242 is coupled to the pushing rod 208 by being disposed below the magnetic solenoid. A second spring 244 is coupled to the pushing rod 208 by being wound around the pushing rod 208 and by being disposed below the protruding portion 240 of the pushing rod 208. The first spring 242 and the second spring 244 are compressed when the pushing rod 208 is pushed down, and provide an upward force on the pushing rod 208 to push the pushing rod 208 back up when the pushing rod 208 is no longer being pushed down.

Figure 4:
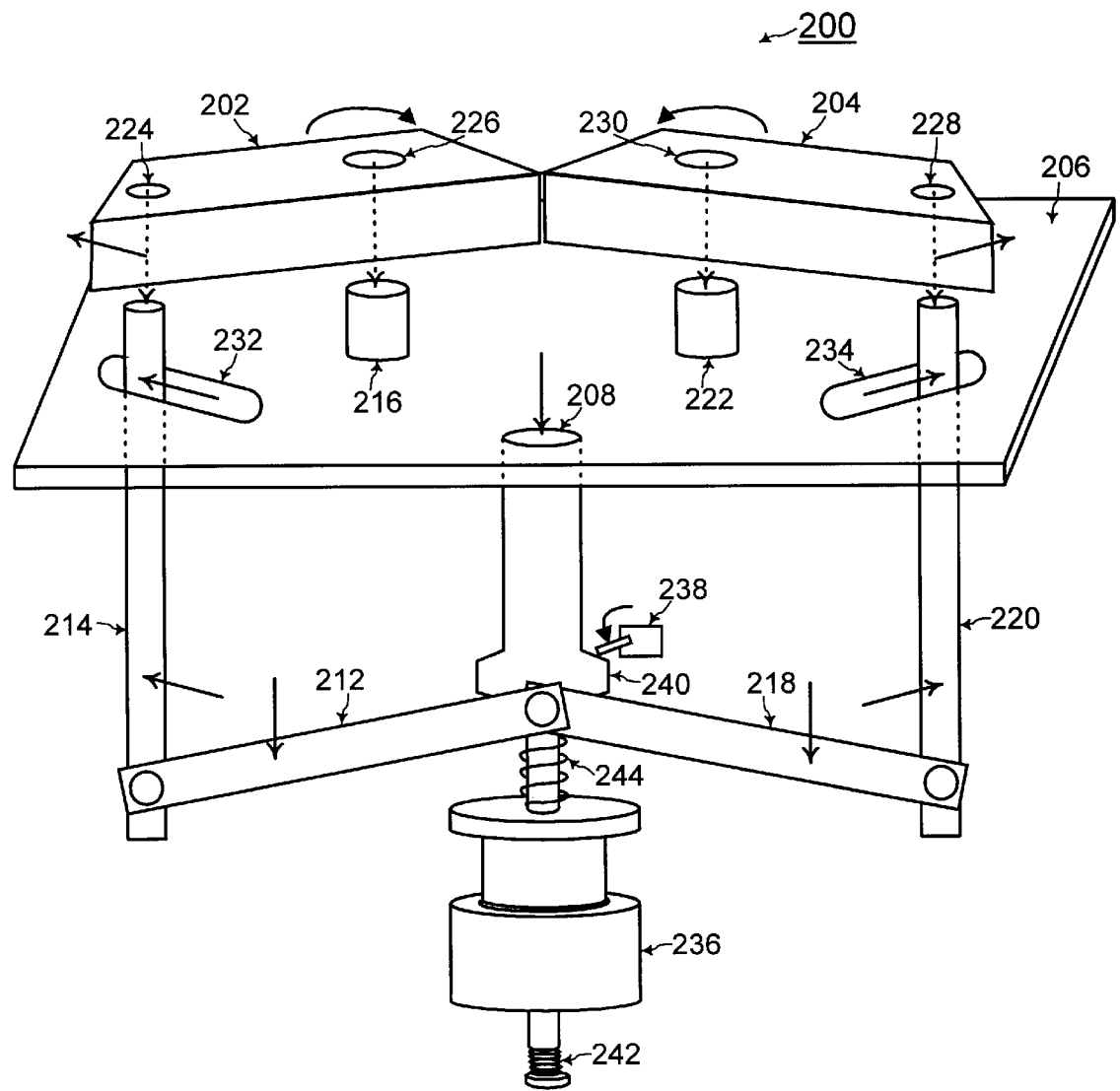
FIG. 4 illustrates the components of the apparatus of FIG. 3 when the pushing rod has been pushed down such that the pincher vises move towards each other for gripping the plug of the IC package tube such that the IC package tube may be pulled away from the plug, according to an embodiment of the present invention.

Referring to FIG. 4, during operation of the apparatus 200, when the pushing rod 208 is pushed down, to no longer extend above the table surface 206 for example, the pushing rod 208 in turn pushes down the center ends of the first toggle beam 212 and the second toggle beam 218 (as illustrated by the arrow in FIG. 4). The outward ends of the first toggle beam 212 and the second toggle beam 218 extend outward pushing the first driving rod 214 and the second driving rod 220 outward (as illustrated by the arrow in FIG. 4). The top ends of the first driving rod 214 and the second driving rod 220 move outward on the table surface 206 according to the first slant opening 232 and the second slant opening 234, respectively, (as illustrated by the arrows in FIG. 4).

When the first driving rod 214 is disposed through the first pincher vise 202, the first driving rod 214 moves the portion of the first pincher vise 202 at the first rod location 224 according to the movement of the first driving rod 214. With this movement of the portion of the first pincher vise 202 at the first rod location 224, the first pincer vise 202 rotates about the first pivot 216 at the first pivot location 226 such that the first pincher vise 202 moves toward the second pincher vise 204.

Similarly, when the second driving rod 220 is disposed through the second pincher vise 204, the second driving rod 220 moves the portion of the second pincher vise 204 at the second rod location 228 according to the movement of the second driving rod 220. With this movement of the portion of the second pincher vise 204 at the second rod location 228, the second pincher vise 204 rotates about the second pivot 222 at the second pivot location 230 such that the second pincher vise 204 moves toward the first pincher vise 202.

In this manner, when the pushing rod 208 is pushed down, the first pincher vise 202 and the second pincher vise 204 move towards each other to the gripping position as illustrated in FIG. 4. In addition, referring to FIGS. 3 and 4, the switch 238 is initially disposed below the protruding portion 240 of the pushing rod 208. When the pushing rod 208 is pushed down, the protruding portion 240 contacts the switch 230 and toggles the switch 238 to turn on. The switch 238 is coupled to the magnetic solenoid 236.

Figure 5:
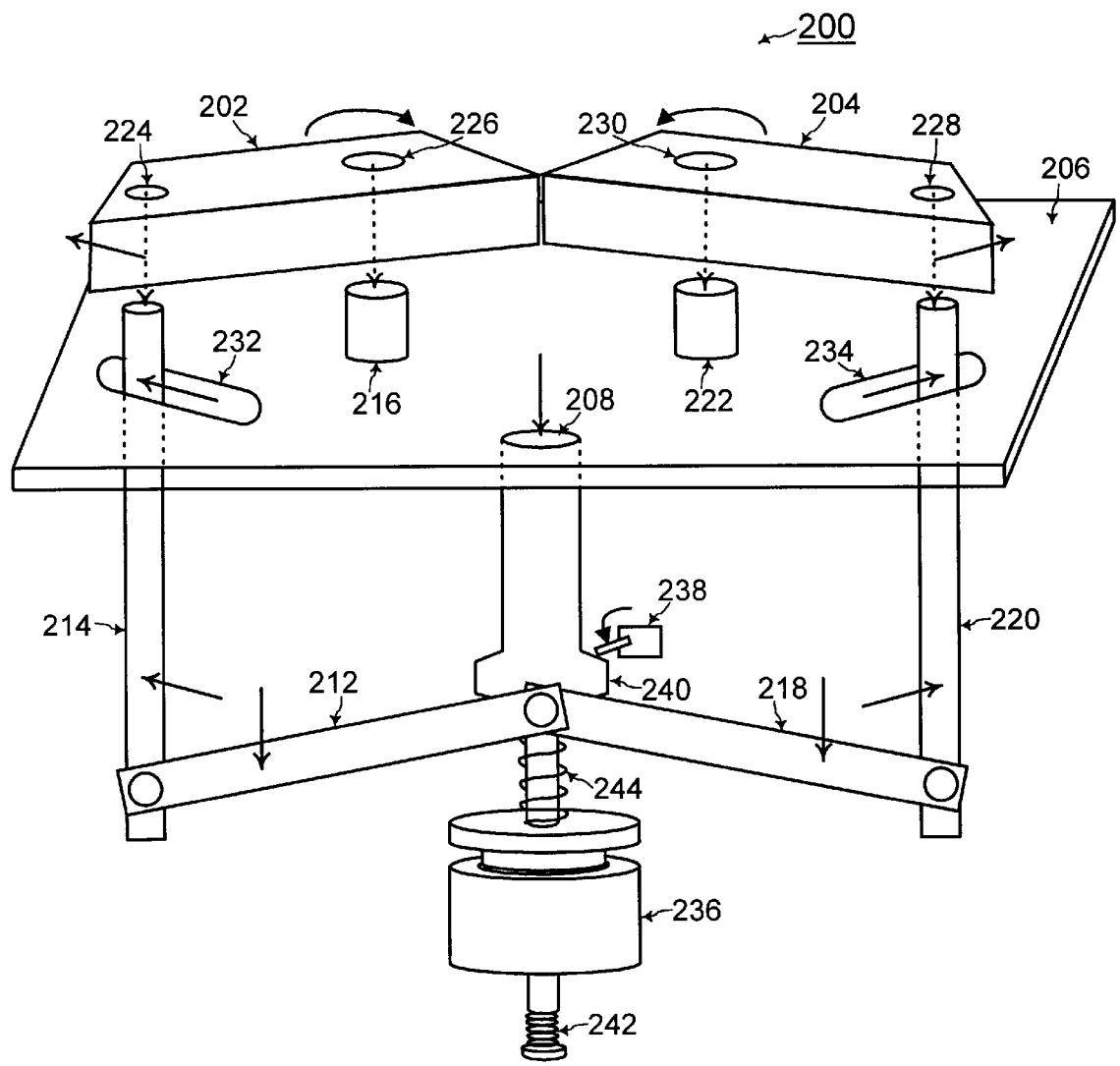
FIG. 5 illustrates the components of the apparatus of FIG. 3 when the pushing rod has been pushed down such that the pincher vises move towards each other with a magnetic solenoid for providing further downward force on the pushing rod, according to an embodiment of the present invention.

Referring to FIG. 5, if the magnetic solenoid 236 is coupled to a power supply that delivers power to the magnetic solenoid 236, when the switch 238 is turned on as the pushing rod 208 is pushed down, the magnetic solenoid 236 moves downward to provide an additional downward force on the pushing rod 208. The magnetic solenoid 236 further pulls the pushing rod 208 downward such that the operator may apply less force to push down the pushing rod 208.

Referring to FIG. 4, if the magnetic solenoid 236 is not coupled to a power supply that delivers power to the magnetic solenoid 236, even when the switch 238 is turned on as the pushing rod 208 is pushed down, the magnetic solenoid 236 does not provide the additional downward force on the pushing rod 208. In that case, the operator applies more force to push down the pushing rod 208 without the aid of the magnetic solenoid 236. Thus, the apparatus 200 operates with or without the magnetic solenoid 236 providing the additional downward force on the pushing rod 208.

Figure 6:
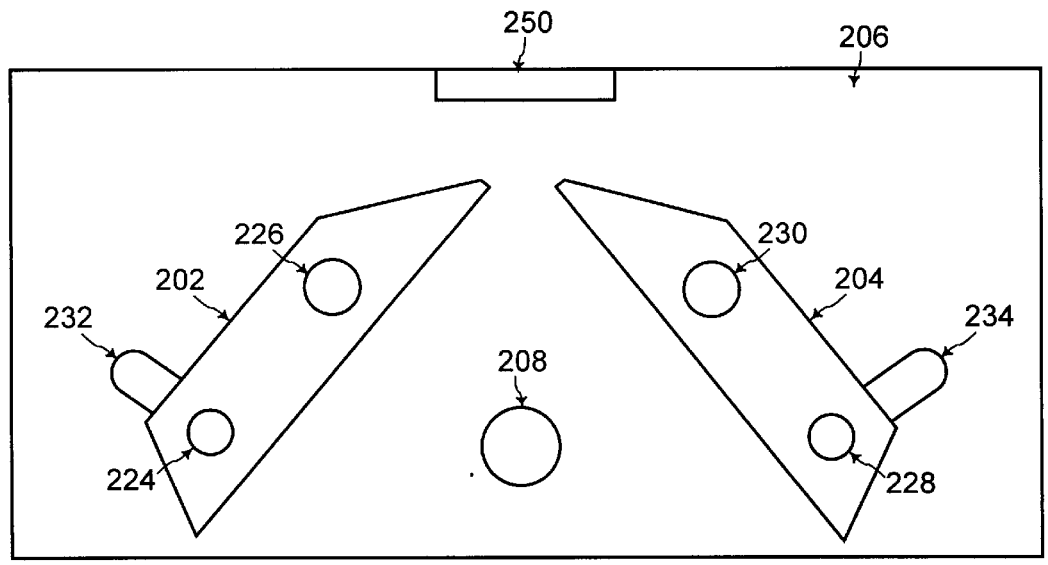
FIG. 6 shows a top view of the pincher vises of FIG. 3 when the pincher vises are apart before the pushing rod is pushed down such that the plug of the IC package tube may be placed between the pincher vises, according to one embodiment of the present invention.

FIG. 6 shows a top view of the apparatus of FIG. 3 when the first pinching vise 202 and the second pinching vise 204 are apart from each other with the pushing rod 208 not being pushed down. A stopper 250 is placed on the table surface 206 for guiding the placement of the plug of the IC package tube between the first pinching vise 202 and the second pinching vise 204.

Figure 7:
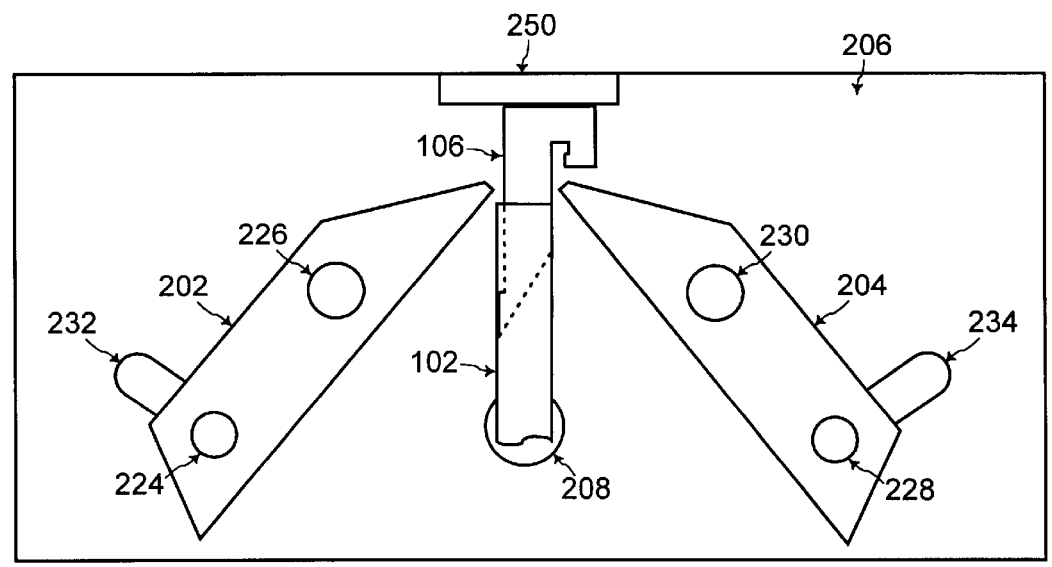
FIG. 7 illustrates the placement of the plug of the IC package tube between the pincher vises of FIG. 6, according to one embodiment of the present invention.
Figure 8:
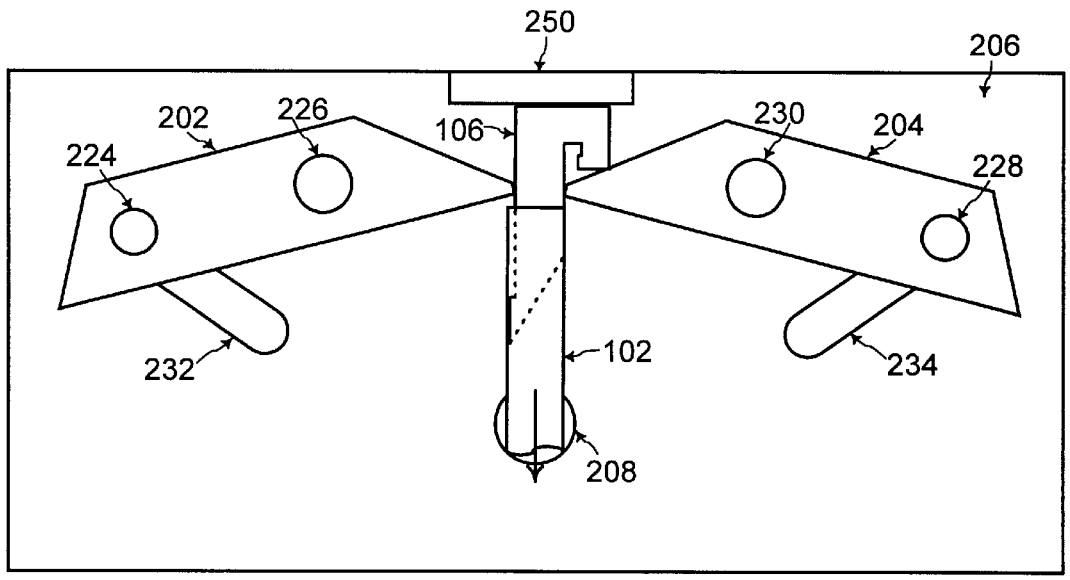
FIG. 8 illustrates the pincher vises moving towards each other when the pushing rod is pushed down for gripping the plug of the IC package placed between the pincher vises of FIG. 6 such that the IC package tube may be pulled away from the plug, according to one embodiment of the present invention.
Figure 9:
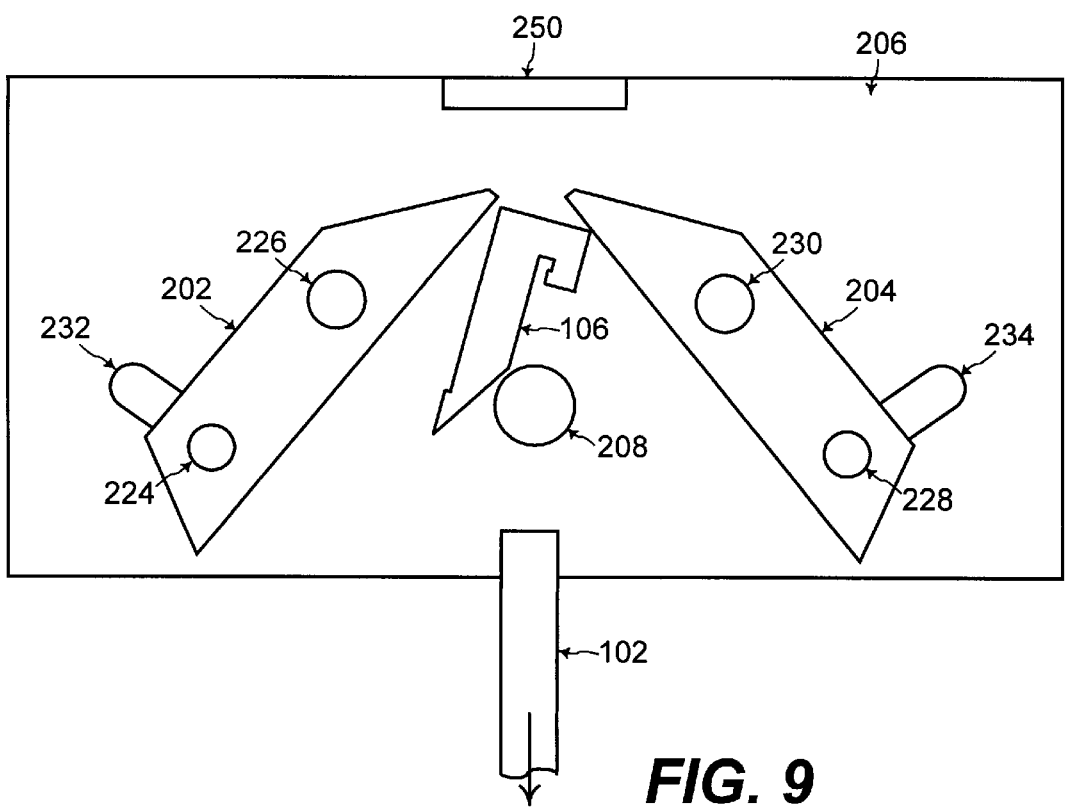
FIG. 9 illustrates the pincher vises moving apart from each other when the pushing rod is no longer pushed down after the IC package tube has been pulled away from the plug, according to one embodiment of the present invention.

Referring to FIGS. 1 and 7, the plug 106 of the IC package tube 102 is placed between the first pinching vise 202 and the second pinching vise 204 that are initially apart from each other. (Only the end of the IC package tube 102 having the plug 106 is shown in FIGS. 7, 8, and 9 for clarity of illustration.) The end of the plug 106 is placed to contact the stopper 250. Referring to FIGS. 7 and 8, as the plug 106 and the IC package tube 102 are placed between the first pinching vise 202 and the second pinching vise 204, the pushing rod 208 is pushed down by the operator with the IC package tube 102 that is placed on a top end of the pushing rod 208.

Referring to FIGS. 4 or 5, and 8, when the pushing rod 208 is pushed down, the first pinching vise 202 and the second pinching vise 204 move towards each other to the gripping position such that the first pinching vise 202 and the second pinching vise 204 grip the plug 106. While the first pinching vise 202 and the second pinching vise 204 grip the plug 106, the operator pulls the IC package tube 102 away from the plug 106.

Figure 10:
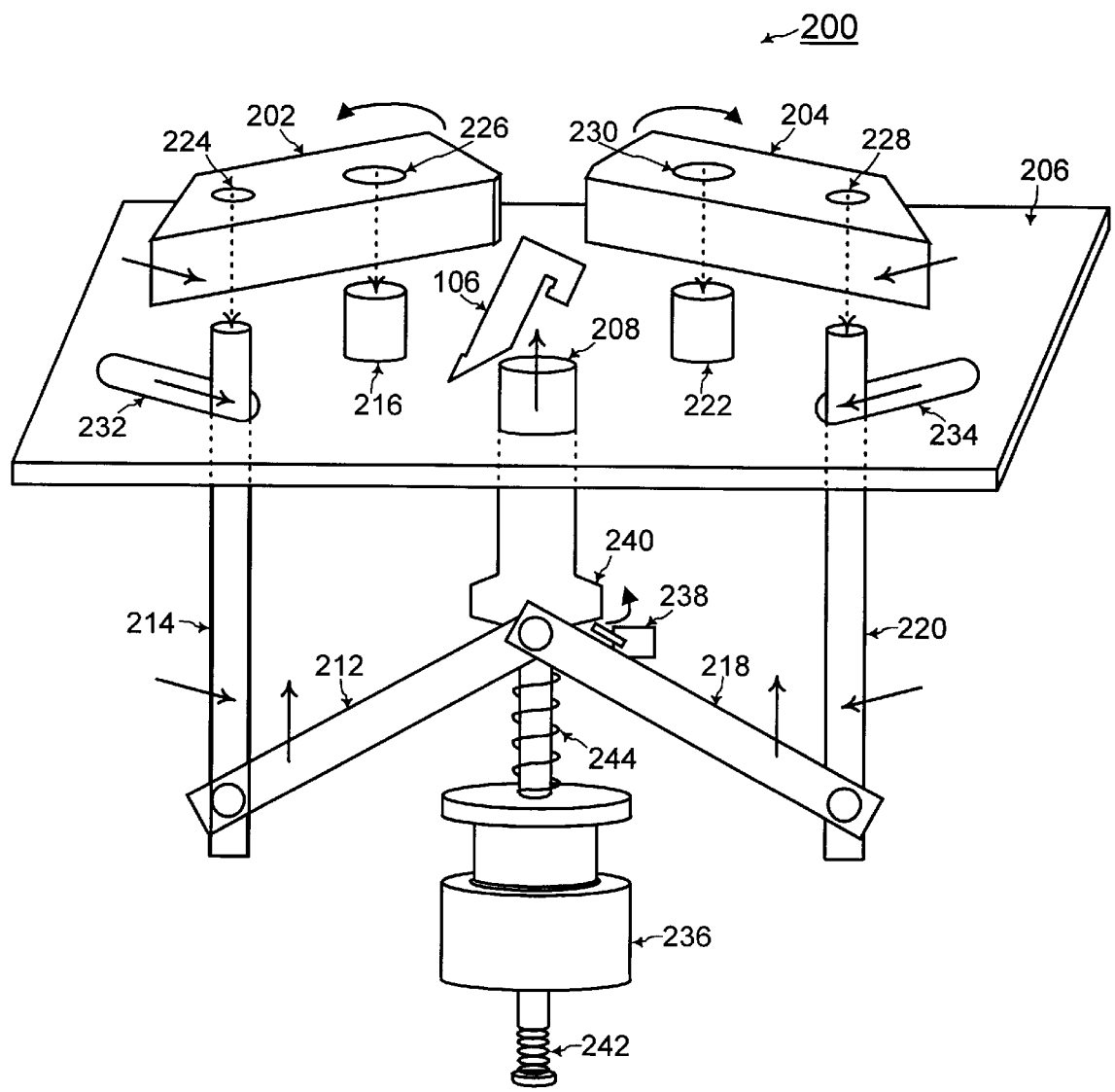
FIG. 10 illustrates the components of the apparatus of FIG. 3 when the pushing rod is no longer pushed down such that the pincher vises move apart from each other after the IC package tube has been pulled away from the plug, according to an embodiment of the present invention.

Referring to FIG. 9, the IC package tube 102 is completely pulled away from the plug 106, and the IC package tube 102 is no longer used to push down on the pushing rod 208. Referring to FIG. 10, when the pushing rod 208 is no longer being pushed down, the first spring 242 and the second spring 244 decompress to push the pushing rod 208 back up. When the pushing rod 208 moves back up, the protruding portion 240 of the pushing rod 208 flips the switch 238 to turn off such that the magnetic solenoid 236 turns off if the magnetic solenoid 236 was turned on.

In addition, when the pushing rod 208 moves back up, the center end of the first toggle beam 212 moves up such that the outward end of the first toggle beam 212 moves back inward (as shown by the arrow in FIG. 10). The first driving rod 214 also moves back inward along the first slant opening 232 (as shown by the arrow in FIG. 10).

When the first driving rod 214 is disposed through the first pincher vise 202, the first driving rod 214 moves the portion of the first pincher vise 202 at the first rod location 224 according to this movement of the first driving rod 214 (as shown by the arrow in FIG. 10). With this movement of the portion of the first pincher vise 202 at the first rod location 224, the first pincher vise 202 rotates about the first pivot 216 at the first pivot location 226 such that the first pincher vise moves 202 away from the second pincher vise 204.

Similarly, when the pushing rod 208 moves back up, the center end of the second toggle beam 218 moves up such that the outward end of the second toggle beam 218 moves back inward (as shown by the arrow in FIG. 10). The second driving rod 220 also moves back inward along the second slant opening 234 (as shown by the arrow in FIG. 10).

When the second driving rod 220 is disposed through the second pincher vise 204, the second driving rod 220 moves the portion of the second pincher vise 204 at the second rod location 228 according to this movement of the second driving rod 220 (as shown by the arrow in FIG. 10). With this movement of the portion of the second pincher vise 204 at the second rod location 228, the second pincher vise 204 rotates about the second pivot 222 at the second pivot location 230 such that the second pincher vise 204 moves away from the first pincher vise 202.

In this manner, the first pincher vise 202 and the second pincher vise 204 move away from each other to the freeing position when the pushing rod 208 is no longer being pushed down. The plug 106 that has been removed from the IC package tube 102 is then free to be removed from the apparatus 200.

In this manner, the apparatus 200 grips the plug 106 of the IC package tube 102 such that the IC package tube 102 may be pulled away from the plug 106 for removal of the plug 106 from the IC package tube 102. Thus, the operator is saved from the hand fatigue and hand pain that may result from repeatedly gripping the plug with a tweezer using the hand. The apparatus 200 tightly grips the plug 106 for effective removal of the plug from the IC package tube during manufacture of a high quantity of IC packages.

The foregoing is by way of example only and is not intended to be limiting. For example, the present invention is described for the IC package tube 102 as an example IC package container. However, the present invention may be used for removing the plug from other types of IC package containers, as would be apparent to one of ordinary skill in the art from the description herein.

Furthermore, as will be understood by those skilled in the art, the structures described herein may be made or used in the same way regardless of their position and orientation. Accordingly, it is to be understood that terms and phrases such as "down," "up," "on," "outward," and "inward," as used herein refer to relative location and orientation of various portions of the structures with respect to one another, and are not intended to suggest that any particular absolute orientation with respect to external objects is necessary or required. The present invention is limited only as defined in the following claims and equivalents thereof.

We claim:

1. An apparatus for gripping a plug of an IC package container when said IC package container is pulled away from said plug, the apparatus comprising:
    a first pincher vise that is at a gripping position when said first pincher vise is gripping said plug and that is at a freeing position when said first pincher vise is not gripping said plug;
    a second pincher vise that is at a gripping position when said second pincher vise is gripping said plug and that is at a freeing position when said second pincher vise is not gripping said plug;
    a table surface having said first pincher vise and said second pincher vise disposed thereon;
    a pushing rod coupled to said first pincher vise and said second pincher vise, wherein said pushing rod extends up above said table surface when said first pincher vise and said second pincher vise are at said freeing position; and
    a motion translation mechanism for moving said first pincher vise and said second pincher vise to said gripping position when said pushing rod is pushed down with respect to said table surface when said IC package container is placed on said table surface, and for moving said first pincher vise and said second pincher vise to said freeing position when said pushing rod is no longer pushed down after said IC package container has been pulled away from said plug to be removed from the table surface.

2. The apparatus of claim 1, wherein said motion translation mechanism comprises:
    a first driving rod having a top end and a bottom end, said top end of said first driving rod being disposed through said first pincher vise at a first rod position of said first pincher vise;
    a first pivot disposed through said first pincher vise at a first pivot location of said first pincher vise;
    wherein a movement of said first driving rod correspondingly moves a portion of said first pincher vise at said first rod position of said first pincher vise such that said first pincher vise rotates about said first pivot that is fixed at said first pivot location of said first pincher vise;
    and wherein said first driving rod moves to an extended position such that said first pincher vise rotates about said first pivot toward said gripping position;
    and wherein said first driving rod moves to an unextended position such that said first pincher vise rotates about said first pivot toward said freeing position;
    a second driving rod having a top end and a bottom end, said top end of said second driving rod being disposed through said second pincher vise at a second rod position of said second pincher vise;
    a second pivot disposed through said second pincher vise at a second pivot location of said second pincher vise;
    wherein a movement of said second driving rod correspondingly moves a portion of said second pincher vise at said second rod position of said second pincher vise such that said second pincher vise rotates about said second pivot that is fixed at said second pivot location of said second pincher vise;
    and wherein said second driving rod moves to an extended position such that said second pincher vise rotates about said second pivot toward said gripping position;
    and wherein said second driving rod moves to an unextended position such that said second pincher vise rotates about said second pivot toward said freeing position;
    a first toggle beam having an outward end and a center end, said outward end of said first toggle beam being coupled to said bottom end of said first driving rod; and
    a second toggle beam having an outward end and a center end, said outward end of said second toggle beam being coupled to said bottom end of said second driving rod;
    wherein said pushing rod is coupled to said center end of said first toggle beam and to said center end of said second toggle beam;

and wherein said first driving rod and said second driving rod are at said unextended position such that said first pincher vise and said second pincher vise are at said freeing position when said pushing rod is not pushed down;

and wherein said pushing rod is pushed down such that said first toggle beam moves said first driving rod to said extended position to move said first pincher vise to said gripping position, and such that said second toggle beam moves said second driving rod to said extended position to move said second pincher vise to said gripping position.

3. The apparatus of claim 1, further comprising:

a magnetic solenoid, coupled to said pushing rod, for providing an added downward force on said pushing rod when said pushing rod is pushed down.

4. The apparatus of claim 3, further comprising:

a switch, coupled to said magnetic solenoid and disposed to contact said pushing rod, that is switched on when said pushing rod is pushed down to turn on said magnetic solenoid for providing said added downward force on said pushing rod;

wherein said switch is turned off, when said pushing rod moves back up, to turn off said magnetic solenoid.

5. The apparatus of claim 3, further comprising:

a spring, coupled to said pushing rod, for providing an upward force on said pushing rod such that said pushing rod moves back up when said pushing rod is no longer being pushed down after said IC package container has been pulled away from said plug;

wherein said first pincher vise and said second pincher vise move to said freeing position when said pushing rod moves back up.

6. The apparatus of claim 1, further comprising:

a spring, coupled to said pushing rod, for providing an upward force on said pushing rod such that said pushing rod moves back up when said pushing rod is no longer being pushed down after said IC package container has been pulled away from said plug;

wherein, when said pushing rod is pushed back up by said spring, said first pincher vise and said second pincher vise move to said freeing position.

7. The apparatus of claim 1, wherein said plug of said IC package container is placed between said first pincher vise and said second pincher vise, and wherein said IC package container is a tube that is placed on a top end of said pushing rod such that said tube is used to push down on said pushing rod.

8. An apparatus for gripping a plug of an IC package container when said IC package container is pulled away from said plug, the apparatus comprising:

a first pincher vise that is at a gripping position when said first pincher vise is gripping said plug and that is at a freeing position when said first pincher vise is not gripping said plug;

a second pincher vise that is at a gripping position when said second pincher vise is gripping said plug and that is at a freeing position when said second pincher vise is not gripping said plug;

a table surface having said first pincher vise and said second pincher vise disposed thereon;

a pushing rod coupled to said first pincher vise and said second pincher vise, wherein said pushing rod extends up above said table surface when said first pincher vise and said second pincher vise are at said freeing position;

means for moving said first pincher vise and said second pincher vise to said gripping position when said pushing rod is pushed down with respect to said table surface when said IC package container is placed on said table surface; and means for moving said first pincher vise and said second pincher vise to said freeing position when said pushing rod is no longer pushed down after said IC package container has been pulled away from said plug to be removed from the table surface.

9. The apparatus of claim 8, further comprising:

a magnetic solenoid, coupled to said pushing rod, for providing an added downward force on said pushing rod when said pushing rod is pushed down;

wherein said added downward force on said pushing rod further moves said first pincher vise and said second pincher vise to said gripping position.

10. The apparatus of claim 9, further comprising:

a switch, coupled to said magnetic solenoid and disposed to contact said pushing rod, that is switched on when said pushing rod is pushed down to turn on said magnetic solenoid for providing said added downward force on said pushing rod;

wherein said switch is turned off, when said pushing rod moves back up, to turn off said magnetic solenoid.

11. The apparatus of claim 9, further comprising:

a spring, coupled to said pushing rod, for providing an upward force on said pushing rod such that said pushing rod moves back up when said pushing rod is no longer being pushed down after said IC package container has been pulled away from said plug;

wherein said first pincher vise and said second pincher vise move to said freeing position when said pushing rod moves back up.

12. The apparatus of claim 8, further comprising:

a spring, coupled to said pushing rod, for providing an upward force on said pushing rod such that said pushing rod moves back up when said pushing rod is no longer being pushed down after said IC package container has been pulled away from said plug;

wherein said first pincher vise and said second pincher vise move to said freeing position when said pushing rod moves back up.

13. The apparatus of claim 8, wherein said plug of said IC package container is placed between said first pincher vise and said second pincher vise, and wherein said IC package container is a tube that is placed on a top end of said pushing rod such that said tube is used to push down on said pushing rod.

\* \* \* \* \*